United States Patent
Chiang et al.

(10) Patent No.: US 11,088,196 B2
(45) Date of Patent: Aug. 10, 2021

(54) METAL REFLECTOR GROUNDING FOR NOISE REDUCTION IN LIGHT DETECTOR

(71) Applicant: Taiwan Semiconductor Manufacturing Co., Ltd., Hsin-Chu (TW)

(72) Inventors: Yen-Ting Chiang, Tainan (TW); Ching-Chun Wang, Tainan (TW); Dun-Nian Yaung, Taipei (TW); Jen-Cheng Liu, Hsin-Chu (TW); Jhy-Jyi Sze, Hsin-Chu (TW); Shyh-Fann Ting, Tainan (TW); Yimin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/684,871

(22) Filed: Nov. 15, 2019

(65) Prior Publication Data

US 2021/0151495 A1 May 20, 2021

(51) Int. Cl.
*H01L 27/146* (2006.01)

(52) U.S. Cl.
CPC .. *H01L 27/14649* (2013.01); *H01L 27/14629* (2013.01); *H01L 27/14636* (2013.01); *H01L 27/14683* (2013.01)

(58) Field of Classification Search
CPC ......... H01L 27/14623; H01L 27/14629; H01L 27/14643
USPC ....................................................... 257/432
See application file for complete search history.

(56) References Cited

U.S. PATENT DOCUMENTS

| | | | |
|---|---|---|---|
| 8,357,958 B2 | 1/2013 | Cummins | |
| 9,178,100 B2 | 11/2015 | Webster et al. | |
| 10,680,024 B2 | 6/2020 | Huang et al. | |
| 2012/0050554 A1 | 3/2012 | Levine et al. | |
| 2013/0200251 A1 | 8/2013 | Velichko | |
| 2014/0077323 A1* | 3/2014 | Velichko | H01L 27/14629 257/432 |
| 2014/0132812 A1* | 5/2014 | Soda | H01L 27/14685 348/302 |
| 2015/0069564 A1* | 3/2015 | Hatano | H01L 27/1464 257/432 |
| 2016/0020232 A1* | 1/2016 | Fukumizu | G02B 1/116 257/229 |
| 2017/0005121 A1* | 1/2017 | Lenchenkov | H04N 5/353 |
| 2018/0108698 A1* | 4/2018 | Peng | H01L 27/14609 |
| 2018/0277584 A1* | 9/2018 | Maruyama | H01L 27/14623 |
| 2018/0286908 A1* | 10/2018 | Yamazaki | H01L 27/14645 |
| 2019/0140000 A1* | 5/2019 | Kitamura | H01L 27/1464 |
| 2019/0181167 A1* | 6/2019 | Yeo | H01L 27/14612 |

\* cited by examiner

*Primary Examiner* — Caleen O Sullivan
(74) *Attorney, Agent, or Firm* — Eschweiler & Potashnik, LLC (57) ABSTRACT

The problem of reducing noise in image sensing devices, especially NIR detectors, is solved by providing ground connections for the reflectors. The reflectors may be grounded through vias that couple the reflectors to grounded areas of the substrate. The grounded areas of the substrate may be P+ doped areas formed proximate the surface of the substrate. In particular, the P+ doped areas may be parts of photodiodes. Alternatively, the reflectors may be grounded through a metal interconnect structure formed over the front side of the substrate.

20 Claims, 13 Drawing Sheets

METAL REFLECTOR GROUNDING FOR NOISE REDUCTION IN LIGHT DETECTOR

BACKGROUND

Integrated circuits (ICs) with image sensors are used in a wide range of electronic devices such as cameras and cell phones. In recent years, complementary metal-oxide semiconductor (CMOS) image sensors have largely replaced charge-coupled device (CCD) image sensors. Compared to CCD image sensors, CMOS image sensors are favored due to low power consumption, small size, fast data processing, a direct output of data, and low manufacturing cost. Some types of CMOS image sensors include frontside illuminated (FSI) image sensors and backside illuminated (BSI) image sensors. Many of these image sensors have been optimized for detecting visible light. There is, however, a growing demand for image sensors that detect non-visible radiation, especially near-infrared (NIR) for security, personal authentication, and range finding applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Backside illuminated CMOS image sensors suitable for detecting visible light require enhanced sensitivity for use in NIR sensing applications. One approach to providing enhanced sensitivity is to increase the thickness of the photo adsorption layer of the substrate. This approach has limitations such as decreasing visible image quality through increased lateral crosstalk. Another approach to providing enhanced sensitivity is to use reflectors on the frontside of the substrate. It has been found, however, that charge accumulation on the reflectors can become a source of noise.

The present disclosure in various embodiments solves the problem of reducing noise in image sensing devices, especially NIR detectors, by providing ground connections for the reflectors. In some embodiments, the reflectors are grounded through vias that couple the reflectors to grounded areas of the substrate. In some of these teachings, the grounded areas of the substrate are $P^+$ doped areas that may be formed proximate the surface of the substrate. In some of these teachings, the $P^+$ doped areas are parts of photodiodes. In some others of these teachings, the reflectors are grounded through a metal interconnect structure formed over the front side of the substrate.

A semiconductor images sensing IC device according to the present teachings may include an array of photodiodes or other CMOS image sensors formed in a semiconductor substrate. After forming the photodiode array, a first inter-level dielectric (ILD0) layer may be formed over the substrate surface. Vias are formed through the first inter-level dielectric layer to form contacts with the substrate. In some of these teachings, one or more of those vias will be used to couple a subsequently formed metal reflector with an area of the substrate held at ground potential. A hard mask may be formed over the first inter-level dielectric layer. The hard mask may be used to selectively pattern an opening partway through the inter-level dielectric layer. The opening may be filled with metal. A planarization process stopping on the hard mask may be used to remove excess metal. The remaining metal may form one or more reflectors that are spaced from the substrate by the inter-level dielectric layer.

A first metallization layer (M1) may be formed over the hard mask. Forming the first metallization layer may include depositing dielectric, etching to form openings through the dielectric, and filling the openings to form various metal features. In some of these teachings, one of those openings is formed over a reflector and one of the metal features is formed in direct contact with the reflector. The reflector may then be grounded through the metal feature.

During operation of a semiconductor image sensing IC device according to the present disclosure, electrical charge carriers may transfer to the reflector. Those charges may be drained through a ground connection before they accumulate sufficiently to create an electrical field that could be a source of noise in the IC device.

Figure 1:
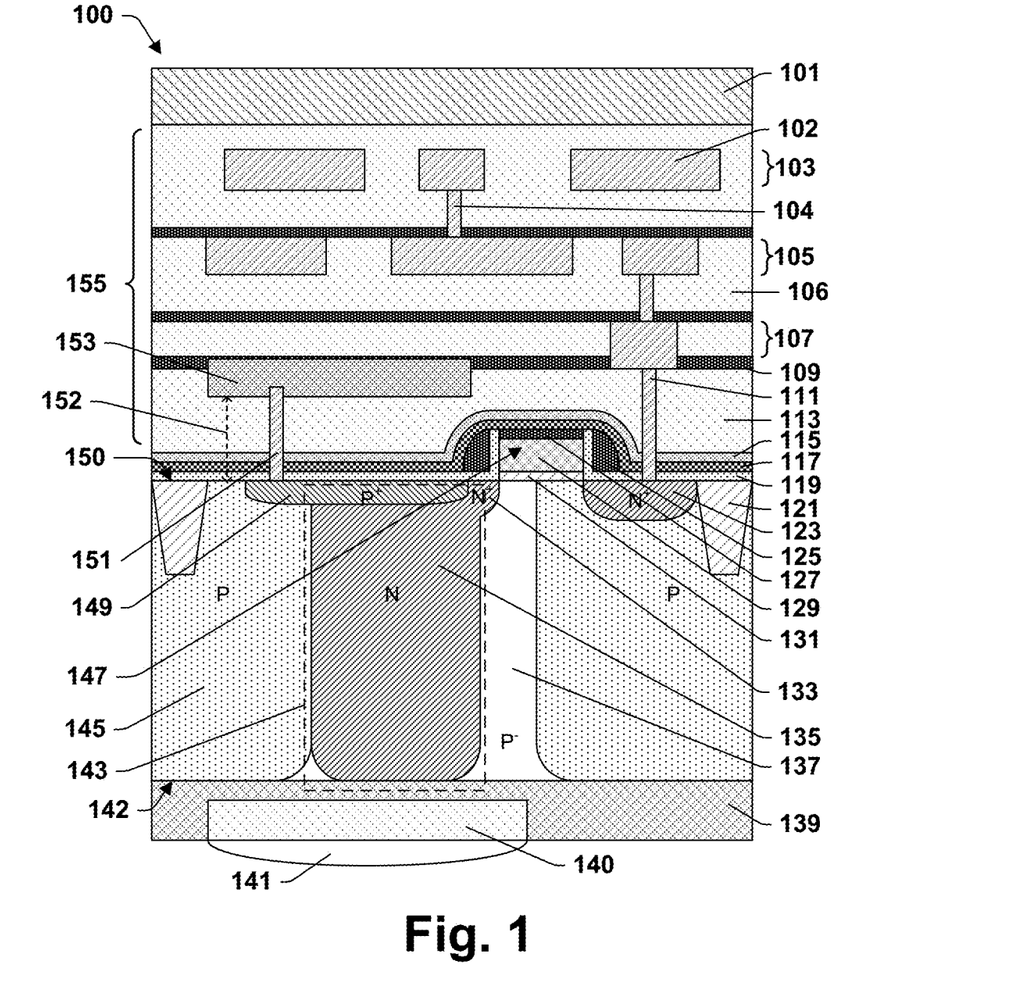
FIG. 1 illustrates a cross-sectional view of an integrated circuit (IC) device according to some aspects of the present disclosure.

FIG. 1 illustrates an IC device 100 according to some aspects of the present disclosure. The IC device 100 includes a metal interconnect structure 155 formed over a front side 150 of a semiconductor substrate 137. A lens 141 on a back side 142 of the substrate 137 focuses light on a photodiode 143 formed within substrate 137. The photodiode 143 is a pinned photodiode that includes a deep N doped region 135 and a shallow $P^+$ doped pinning layer 149 proximate the surface of front side 150. The photodiode 143 could alternatively be a P-I-N photodiode or another type of radiation sensing device. A reflector 153 is positioned above the front side 150 to reflect light passing through the substrate 137 back onto the photodiode 143 in order to increase radiation sensitivity. In accordance with some aspects of the present teachings, the reflector 153 is grounded to the pinning layer 149 of the photodiode 143 by a via 151.

The reflector 153 may be located proximate the substrate 137. In some of the present teachings, the reflector 153 is formed within an interlevel dielectric layer 113 that is the first interlevel dielectric layer 113 above the substrate 137. In some of the present teachings, the interlevel dielectric layer 113 is a low-κ dielectric layer. The reflector 153 is separated from the substrate 137 by several thin films and a portion of interlevel dielectric layer 113. The several thin films may include, for example, an oxide layer 119, a resist protective oxide (RPO) layer 117, and or a contact etch stop layer 115 or the like. The reflector 153 is a distance 152 from the substrate 137. In some of these teachings, the distance 152 is in the range from 0.01 to 0.5 μm. In some of these teachings, the distance 152 is in the range from 0.05 to 0.3 μm.

The photodiode 143 may be one in an array of like photodiodes formed with the substrate 137. The substrate 137 may be any suitable type of semiconductor substrate. In some of the present teachings, the substrate 137 is a single crystal semiconductor. In some of these teachings, the substrate 137 is silicon. The substrate 137 may also be silicon-geranium, indium phosphide, some other semiconductor material, or the like. A passivation layer 139 may be formed over the back end 142 of the substrate 137. A well with the passivation layer 139 may be occupied by a color filter 140 underneath the micro-lens 141.

The substrate 137 may be lightly P-doped. Deep P-wells 145 may be formed within the substrate 137 adjacent photodiodes 143. Electrical isolation may be provided by shallow trench isolation (STI) structures 121. Alternatively, isolation may be provided by deep trench isolations structures, some other suitable isolation structures, or the like.

The metal interconnect structure 155 may include a plurality of metal interconnect layer such as a first metallization layer 107, a second metallization layer 105, a third metallization layer 103, and additional metallization layers (not shown). Vias 104 may connect metal features 102, such as wires and the like, between adjacent metallization layer 103, 105, 107. Vias 104 and metal features 102 may be formed of metals such as copper, aluminum, gold, tungsten, and the like. Vias 104 and metal features 102 are formed within a matrix of interlevel dielectric 106. The interlevel dielectric 106 may be a low κ dielectric or an extremely low-k dielectric.

A low-k dielectric is a material having a smaller dielectric constant than $SiO_2$. $SiO_2$ has a dielectric constant of about 3.9. Examples of low-k dielectrics include organosilicate glasses (OSG) such as carbon-doped silicon dioxide, fluorine-doped silicon dioxide (otherwise referred to as fluorinated silica glass (FSG), organic polymer low-k dielectrics, and porous silicate glass. An extremely low-k dielectric is a material having a dielectric constant of about 2.1 or less. An extremely low-k dielectric material is generally a low-k dielectric material formed into a porous structure. Porosity reduces the effective dielectric constant.

The photodiode 143 may be selectively couple to a floating diffusion node 123 by a transfer transistor 147. The floating diffusion node 123 may be an $N^+$ doped area of the substrate 137 configured to accumulate charges produced by the interaction of light with the photodiode 143. Additional transistors may be provided to operate the photodiode 143. A single pixel in a photodiode array of the IC device 100 may use two, three, four, five, or six transistors, for example. The coupling of the photodiode 143 with the transfer transistor 147 may include an $N^+$ doped area of the substrate 137 that couples the deep N-well 135 of the photodiode 143 to a channel region of the transfer transistor 147. The transfer transistor 147 may include a gate electrode 129 separated from the substrate 137, which provides the channel region, by a gate dielectric layer 128. A hard mask layer 127 may be present over the gate electrode 129. Spacers 125 may be formed to the sides of the gate electrode 129.

Figure 2:
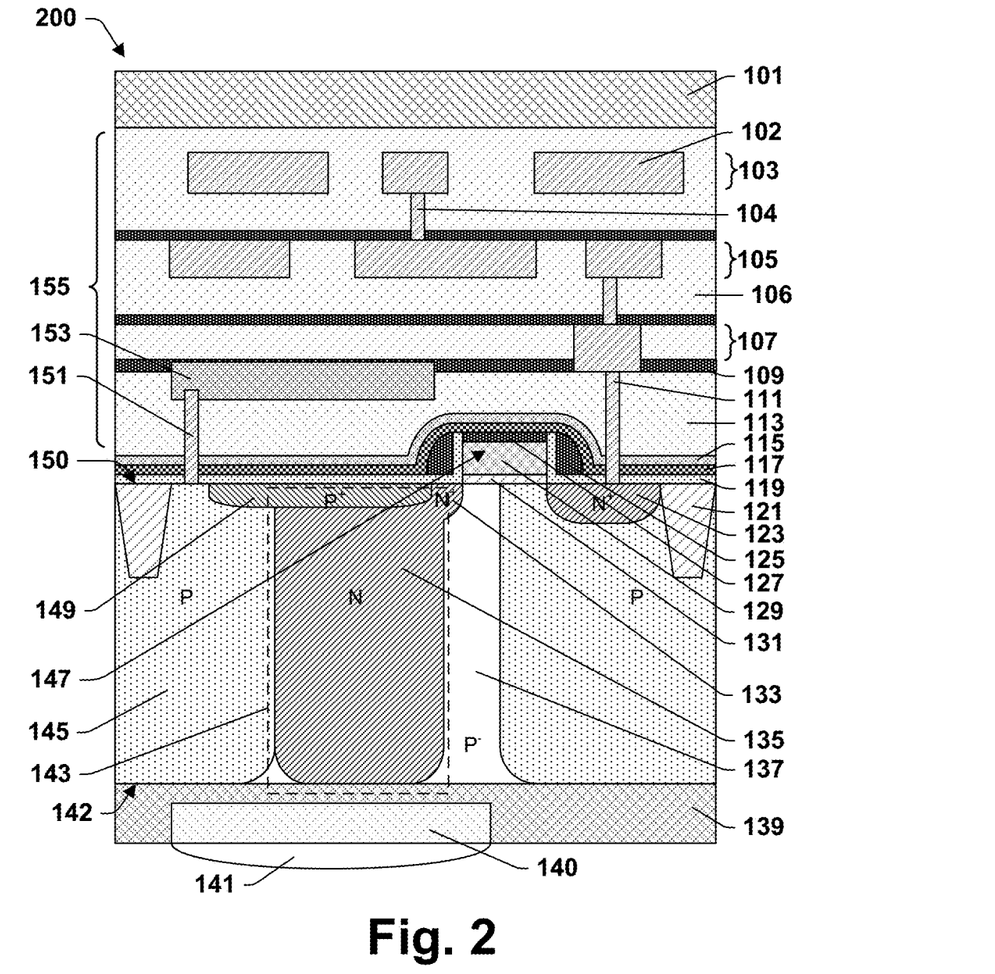
FIG. 2 illustrates a cross-sectional view of an integrated circuit (IC) device according to some other aspects of the present disclosure.

FIG. 2 illustrates an IC device 200 according to some other aspects of the present disclosure. The IC device 200 is similar to the IC device 100 except that in the IC device 200, the via 151 through which the reflector 153 is grounded couples with a deep P-well 145 in the substrate 137 that is not part of the photodiode 143. The deep P-well 145 may be effectively maintained at a ground potential. Charges transferring to the reflector 153 by one or another mechanism may drain through deep P-well 145.

Figure 3:
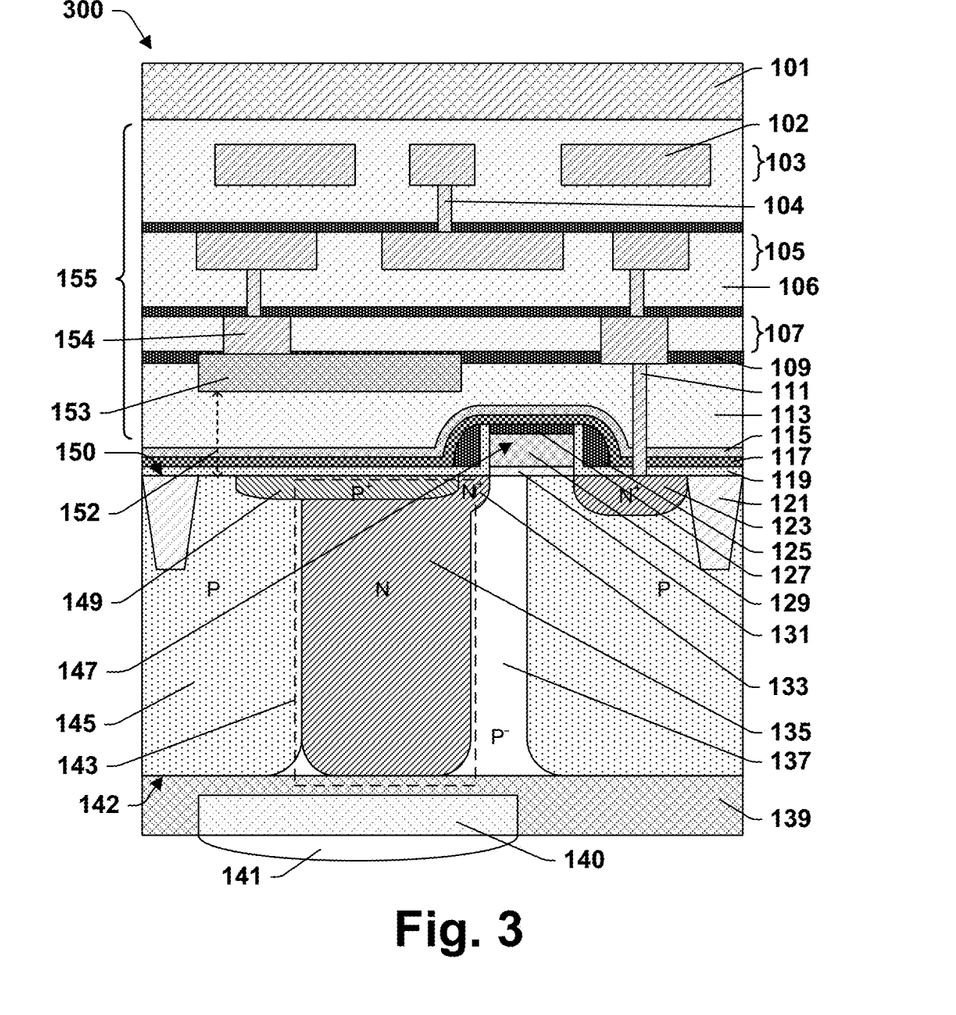
FIG. 3 illustrates a cross-sectional view of an integrated circuit (IC) device according to some other aspects of the present disclosure.

FIG. 3 illustrates an IC device 300 according to some other aspects of the present disclosure. The IC device 300 is similar to the IC device 100 except that in IC device 300 does not include the via 151 that grounds the reflector 153 to the substrate 137 in IC device 100. Instead, the reflector 153 is grounded by a metal feature 154 within the first metallization layer 107. The metal feature 154 may itself be grounded by connections made through the metal interconnect structure 155.

In some embodiments, a support device 101 is affixed to the metal interconnect structure 155 above the substrate 137. The support device 101 may be, for example, a bulk substrate or a second IC chip. In some embodiments, the second IC chip is electrically coupled to the reflector 153 through the metal interconnect structure 155. A second IC chip may comprise a second metal interconnect structure (not shown) arranged over a second semiconductor substrate (not shown).

FIGS. 4-20 provide a series of cross-sectional views 400-2000 that illustrate an integrated circuit device according to the present disclosure at various stages of manufacture according to a process of the present disclosure. Although FIGS. 4-20 are described in relation to a series of acts, it will be appreciated that the order of the acts may in some cases be altered and that this series of acts are applicable to structures other than the ones illustrated. In some embodiments, some of these acts may be omitted in whole or in part. It will also be appreciated that FIGS. 4-20 are not limited to a method of manufacture but rather may stand alone as structures separate from the method.

Figure 4:
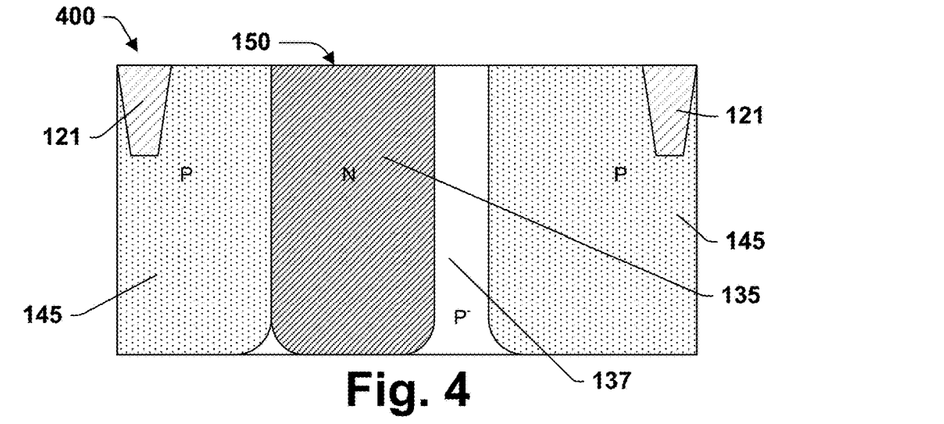
FIGS. 4-20 illustrate a series of cross-sectional views of an IC device undergoing a manufacturing process according to some aspects of the present disclosure.

FIG. 4 illustrate a cross-sectional view 400 of an IC device 100 or the like at an early stage of manufacture. Cross-sectional view 400 illustrates a substrate 137 in which deep P-wells 145 and a deep N-well 135 have been formed. Deep N-well 135 may be formed through or almost through a full thickness of the substrate 137. The substrate 137 may be lightly P-doped. The substrate 137 may be a single crystal semiconductor. In particular, the substrate 137 may be silicon or the like.

As further shown by the cross-sectional view 400 of FIG. 4, shallow trench isolations regions 121 may be formed in the substrate 137. Shallow trench isolations regions 121 may be formed by etching trenches in the substrate 137 and filling the trenches with a dielectric or a dielectric precursor. The dielectric may be silicon dioxide ($SiO_2$) or the like. A planarization process may be used to remove dielectric from the front side 150 of the substrate 137. The planarization process may be chemical mechanical polishing (CMP).

Figure 5:
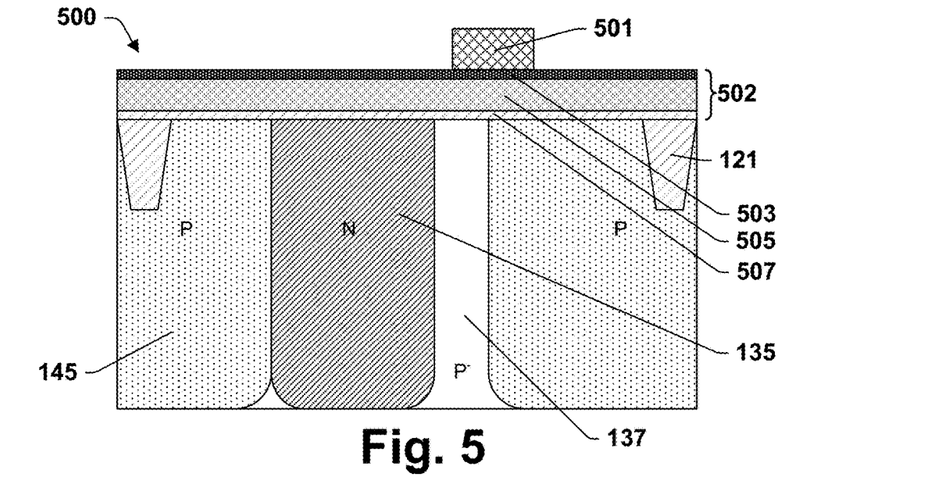

As shown by the cross-sectional view 500 of FIG. 5, a transistor gate stack 502 may be formed over the front side 150 of the substrate 137. The transistor gate stack 502 may include a gate dielectric layer 507, a gate electrode layer 505, and a hard mask layer 503. The gate dielectric layer 507 may be silicon dioxide ($SiO_2$) or any other dielectric suitable for the gate of a CMOS transistor. The gate dielectric layer 507 may be deposited on the substrate 137 or grown by oxidizing a layer at the surface of substrate 137. The gate electrode layer 505 may be doped polysilicon or the like or any other conductor suitable for the gate of a CMOS transistor. The gate electrode layer 505 may be formed by chemical vapor deposition (CVD) or any other suitable process. The hard mask layer 503 may be silicon nitride or the like, or any other material suitable for a hard mask. The hard mask layer 503 may be formed by chemical vapor deposition (CVD) or any other suitable process.

As further shown by the cross-sectional view 500 of FIG. 5, a photoresist mask 501 may be formed and patterned over the transistor gate stack 502. Photoresist mask 501 may be patterned by a photolithographic process. The photoresist mask 501 may be a positive or negative photoresist patterned by selective exposure through a reticle and selective removal of either the exposed or non-exposed portions to transfer the reticle pattern to the photoresist mask 501.

Figure 6:
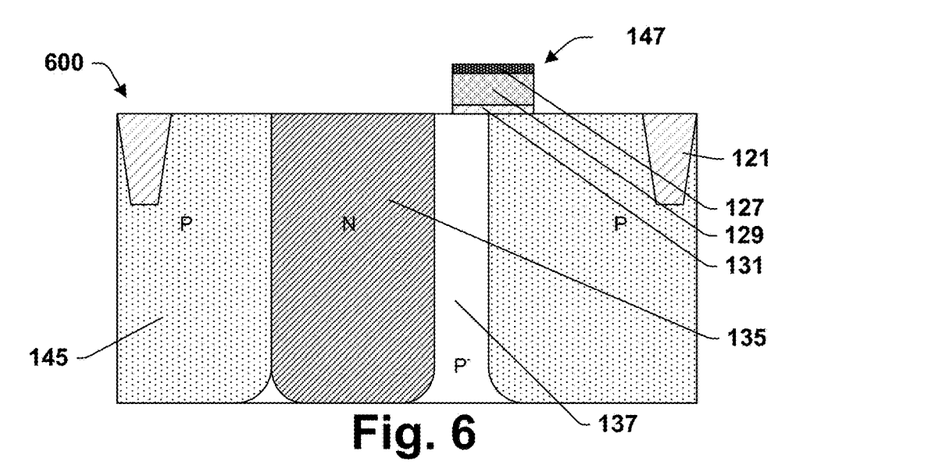

As shown by the cross-sectional view 600 of FIG. 6, the transistor gate stack 502 may be patterned using the photoresist mask 501. The patterning process may include etching through the various layers of transistor gate stack 502. Any suitable etch process may be used. The etching process may dry etch processes, such as plasma etching or the like, and may include multiple stages. Patterning forms the transfer transistor 147 and incudes forming the hard mask 127 from the hard mask layer 503, the gate electrode 129 from the gate electrode layer 505, and the gate dielectric layer 131 from the gate dielectric layer 507.

Figure 7:
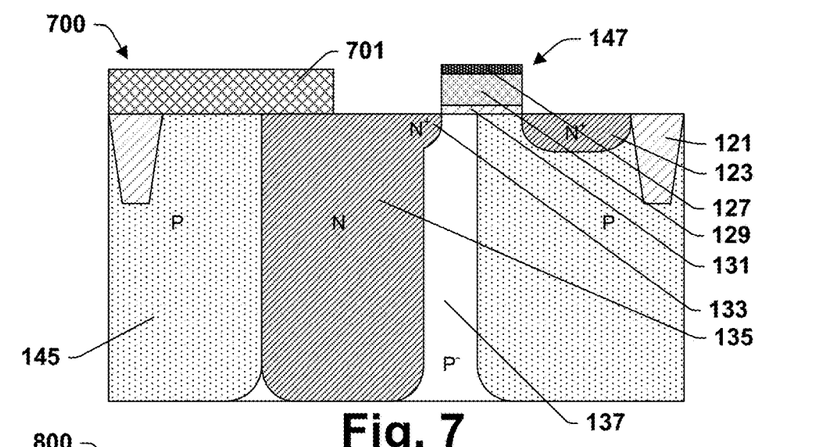

As shown by the cross-sectional view 700 of FIG. 7, after forming the transfer transistor 147 a photoresists mask 701 may be formed over the substrate 137 and the substrate 137 may be doped heavily N$^+$ to form floating diffusion node 123. This doping may also form a source/drain area 133 of deep N-well 135 that provides a source/drain region for the transfer transistor 147 and couples deep N-well 135 to the transfer transistor 147.

Figure 8:
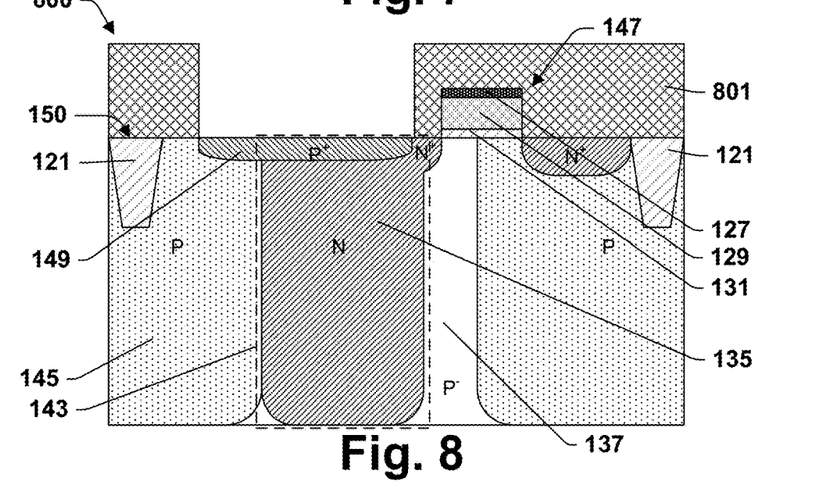

As shown by the cross-sectional view 800 of FIG. 8, the photoresists mask 701 may then be stripped and another photoresists mask 801 formed followed by heavy P$^+$ doping to form the pinning layer 149 of the photodiode 143. As illustrated, the pinning layer 149 may extend beyond the area of the deep N-well 135. The pinning layer 149 may extend to the STI region 121 or stop short of the STI region 121 as shown in this example. In some of these teachings, the pinning layer 149 and other heavily P$^+$ doped regions have a concentration of dopants that is at least $1 \times 10^{18}$ atoms per cm$^3$. In some of these teachings, the heavily P$^+$ doped regions have a concentration of dopants that is at least $1 \times 10^{19}$ atoms per cm$^3$. In some of these teachings, the heavily P$^+$ doped regions have a concentration of dopants that is at least $3 \times 10^{19}$ atoms per cm$^3$.

Figure 9:
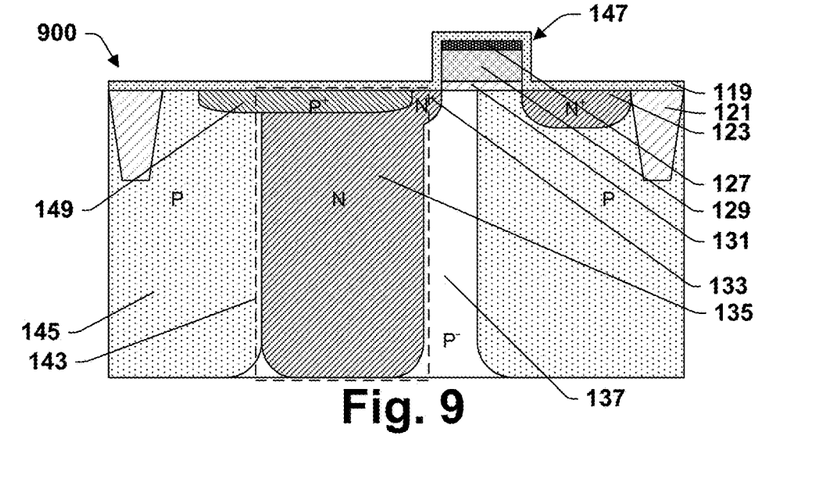

As shown by the cross-sectional view 900 of FIG. 9, the photoresists mask 801 may then be stripped and an oxide layer 119 formed over the surface of the structure shown by the cross-sectional view 800 of FIG. 8. This oxide layer 119 may be formed by CVD, plasma enhanced CVD (PECVD), or the like, or any other suitable process. In some of these teachings, the oxide layer 119 is formed from tetraethyl orthosilicate (TEOS).

Figure 10:
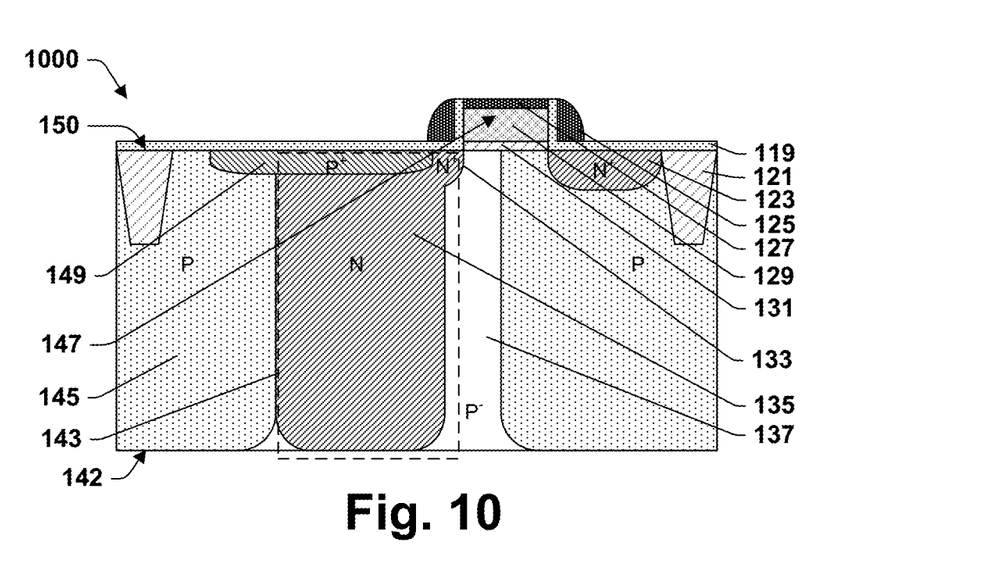

As shown by the cross-sectional view 1000 of FIG. 10, spacers 125 may be formed to the sides of the transfer transistor 147. Forming the spacers 125 may include deposition of silicon nitride or some other spacer material by CVD or the like, or any other suitable process followed by etching to leave only the material that forms the spacers 125.

Figure 11:
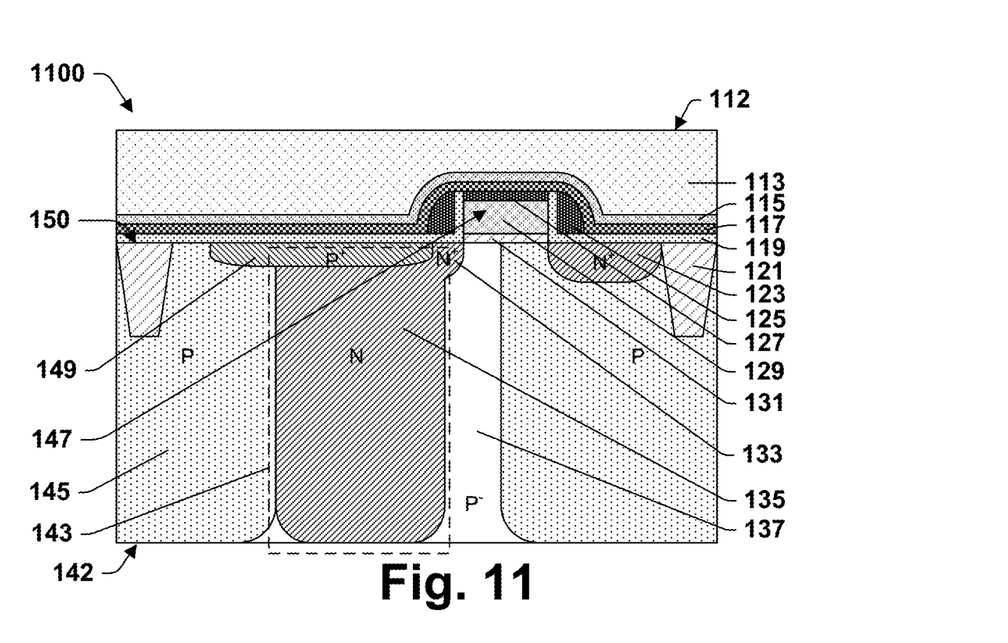

As shown by the cross-sectional view 1100 of FIG. 11, several interfacial layers may be deposited conformally over the structure shown by the cross-sectional view 1000 of FIG. 10. These may include the RPO layer 117, the contact etch stop layer 115, or the like. As further shown by the cross-sectional view 1100 of FIG. 11, a first interlevel dielectric layer 113 (an ILD0 layer) may then be formed. These layers may be formed by any suitable process or combination of processes. The ILD0 may be formed with a planar upper surface 112 or may be subjected to a planarization process after deposition. A planarization process could be CVD or the like.

Figure 12:
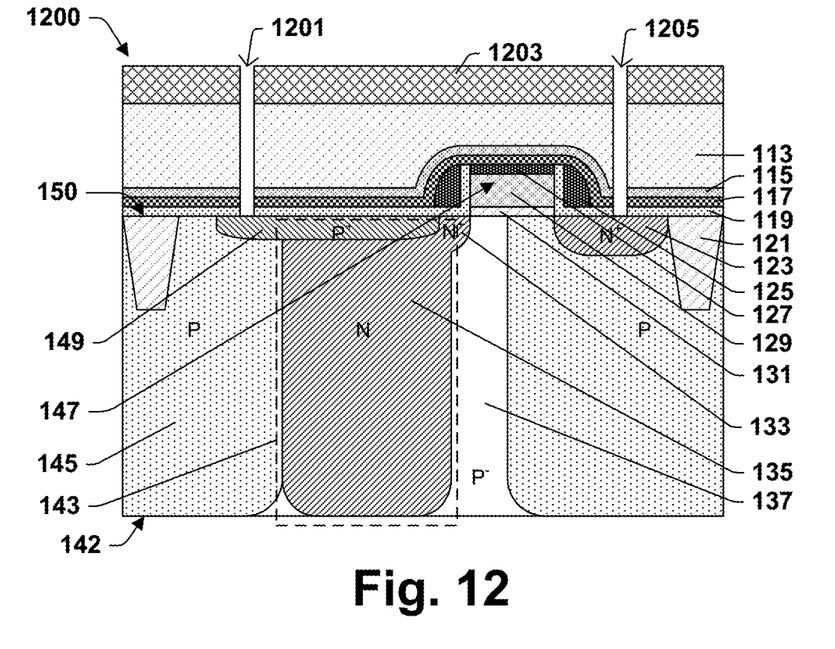

As shown by the cross-sectional view 1200 of FIG. 12, a photoresist mask 1203 may be formed over the interlevel dielectric layer 113 and used to pattern openings through the interlevel dielectric layer 113 and other intervening layers to extend the openings down to the substrate 137. These openings may include an opening 1205 to floating diffusion region 123. In some of these teachings, these openings include an opening 1201 onto the pinning layer 149 of the substrate 137.

Figure 13:
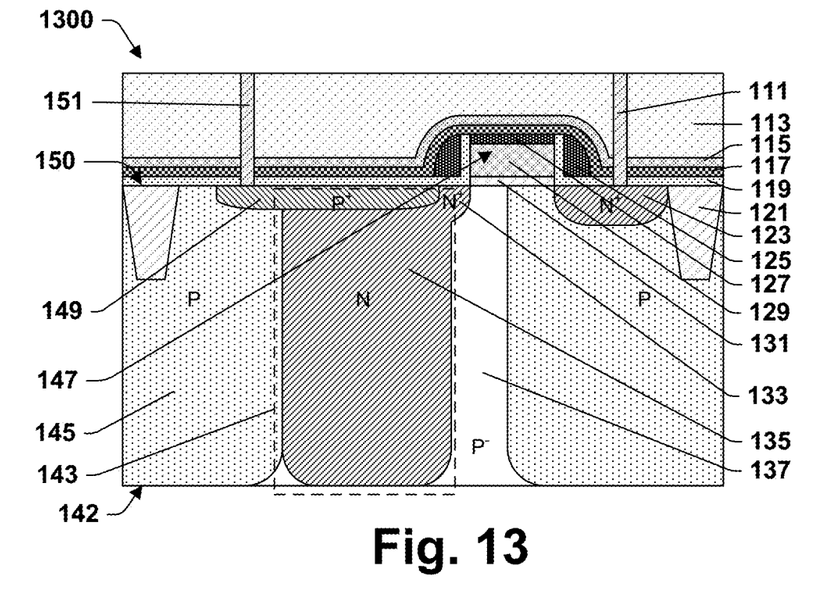

As shown by the cross-sectional view 1300 of FIG. 13, the openings 1201, 1205 shown in the cross-sectional view 1200 of FIG. 12 may be filled with conductive material to form vias through interlevel dielectric layer 113. In particular the opening 1201 may be filled to form the via 151 and the opening 1205 may be filled to form the via 111. The conductive material may be deposited or grown from a seed layer. Filling the openings 1201, 1205 with conductive material may be followed by a planarization step to remove conductive material outside the openings 1201, 1205. Vias 111, 151 may be a metal such as copper, aluminum, gold, tungsten, and the like. In some embodiments, vias 111, 151 are cobalt or the like.

Figure 14:
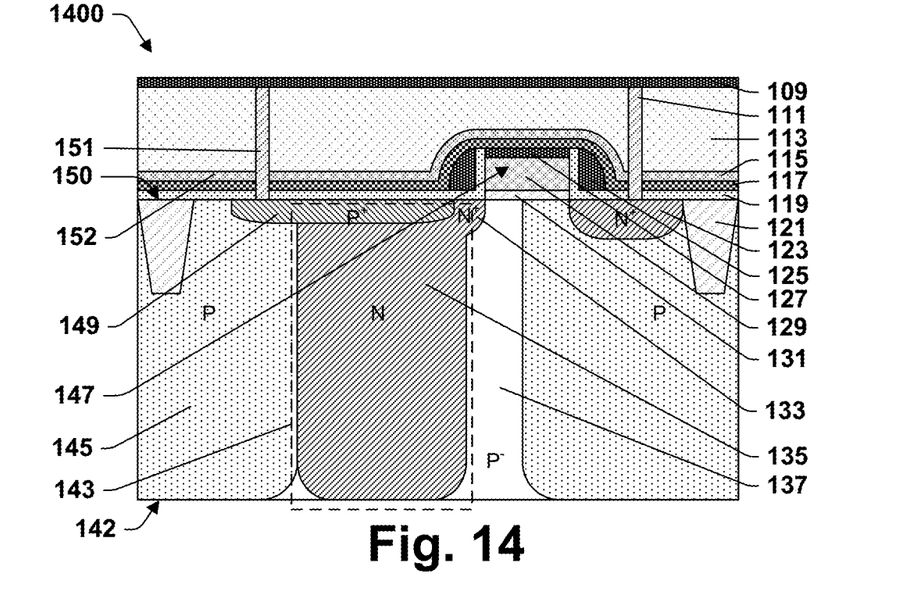

As shown by the cross-sectional view 1400 of FIG. 14, an etch stop layer 109 may be formed over the structure illustrated by the cross-sectional view 1300 of FIG. 13. Etch stop layer 109 may be silicon carbide (SiC) or the like, or some other dielectric material suitable for an etch stop layer. In some embodiments, etch stop layer 109 is deposited to a thickness in the range from 100 Å to 600 Å. In some embodiments, etch stop layer 109 is deposited to a thickness in the range from 300 Å to 500 Å.

Figure 15:
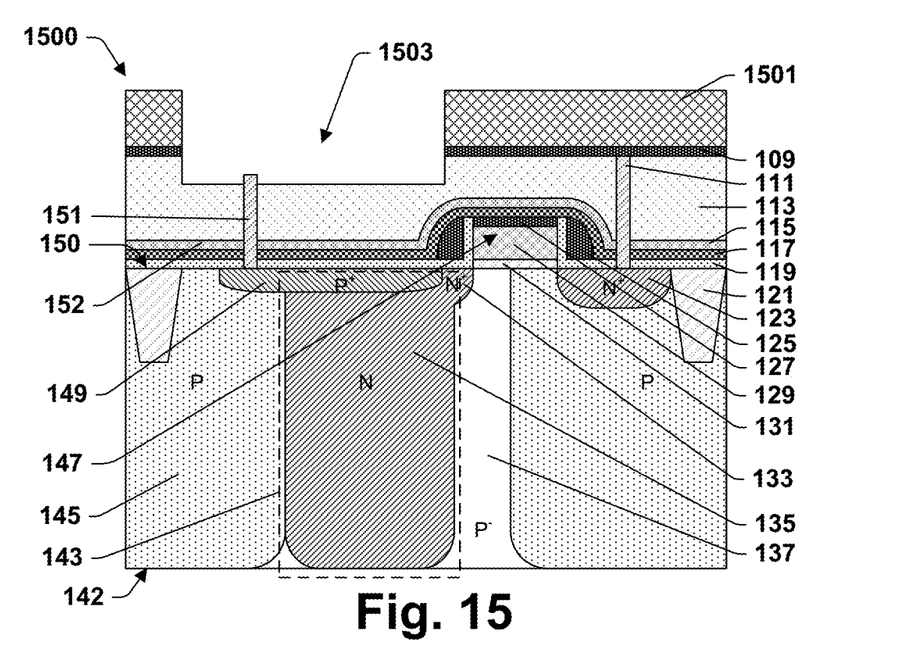

As shown by the cross-sectional view 1500 of FIG. 15, a photoresist mask 1501 may be formed over the structure illustrated by the cross-sectional view 1400 of FIG. 14 and used to etch an opening 1503 through the etch stop layer 109 and part way through the interlevel dielectric layer 113. The material of via 151 may have a lower etch rate than the dielectric of interlevel dielectric layer 113. As a result, via 151 may protrude into the opening 1503.

Figure 16:
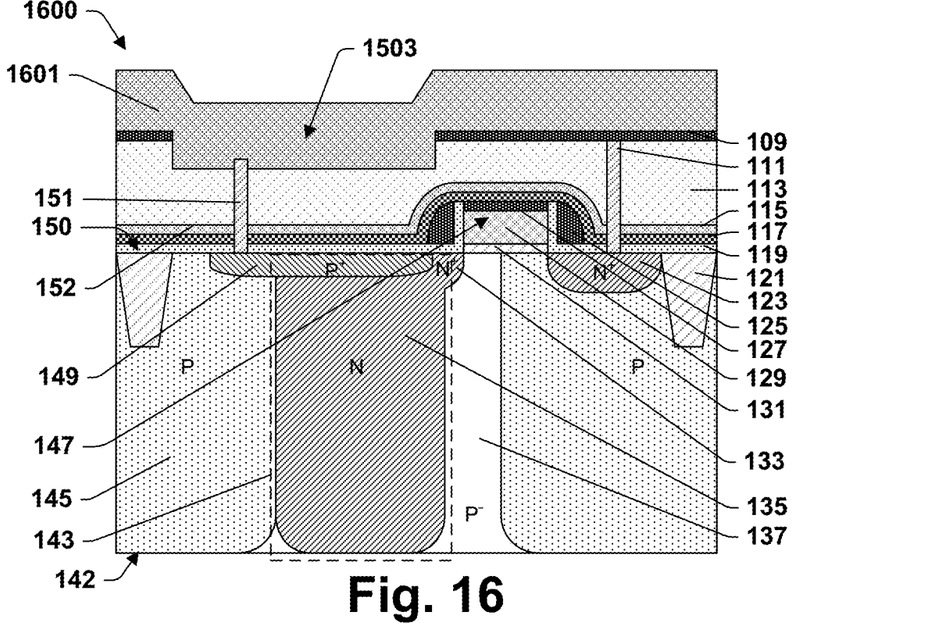

As shown by the cross-sectional view 1600 of FIG. 16, the photoresist mask 1501 may be stripped and metal 1601 may be grown or deposited to fill the opening 1503. The metal 1601 may deposit around the exposed portion of via 151. Metal 1601 may be formed by electroplating, electroless plating, physical vapor deposition (PVD) or the like, or by any other suitable process. The metal 1601 may be any material suitable for a reflector. In some of these teachings, the metal 1601 is an aluminum copper alloy (AlCu) or the like.

Figure 17:
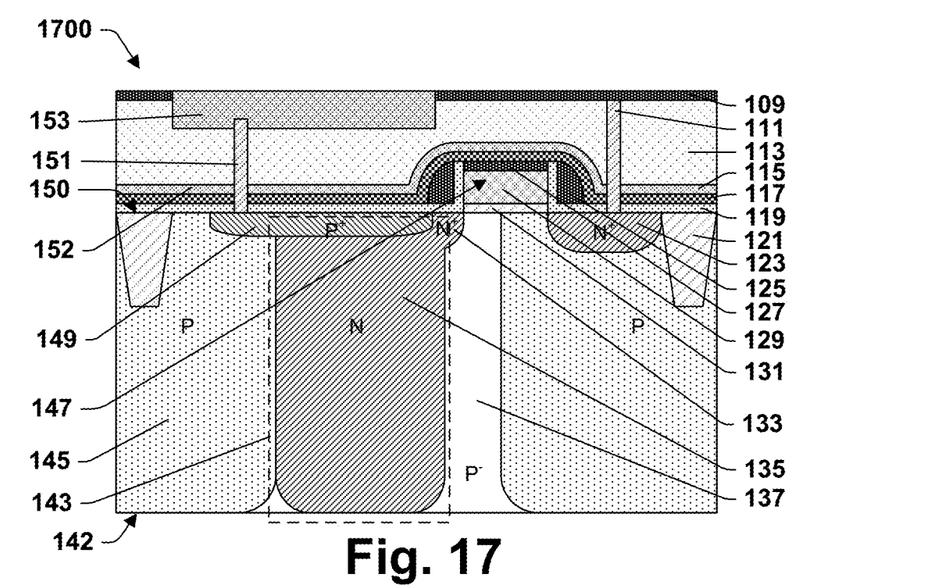

As shown by the cross-sectional view 1700 of FIG. 17, the excess metal 1601 may be removed by a planarization process such as CVD to form the reflector 153. The planarization process may thin the etch stop layer 109. As shown by the cross-sectional view 1800 of FIG. 18, an additional deposition may take place to thicken the etch stop layer 109 and to provide a thickness of the etch stop layer 109 over the reflector 153.

Figure 19:
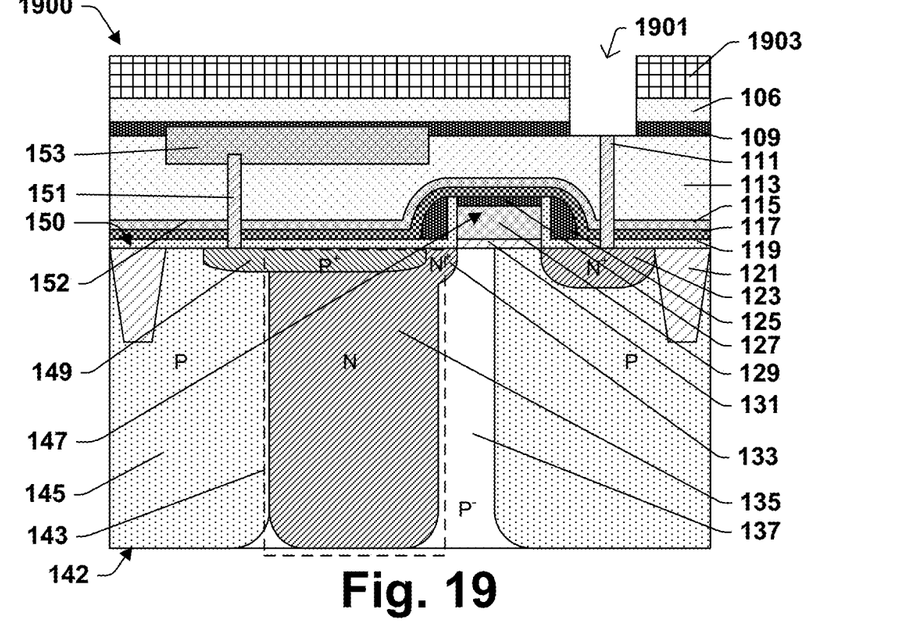

As shown by the cross-sectional view 1900 of FIG. 19, a layer of interlevel dielectric 106 may be formed over the etch stop layer 109. As further shown by the cross-sectional view 1900 of FIG. 19, a photoresist 1903 may be formed over the interlevel dielectric 106 and used to pattern openings 1901 through the interlevel dielectric 106. As shown by the cross-sectional view 2000 of FIG. 20 the openings 1901 may be filled with metal to form metal feature 102 and other metal features of the first metallization layer 107 (M1). The metal may be deposited or grown by any suitable process. A suitable process could be electroplating, electroless plating, physical vapor deposition (PVD) or the like. Additional processing may then be carried out to complete back end of line (BEOL) processing to form the metal interconnect structure 155 and add other features to produce a device such as the IC device 100 shown by FIG. 1.

Variations on the process illustrated by the cross-sectional views 400-2000 of FIGS. 4 to 20 may be used to form other devices according to the present teachings. For example, alternative placement of the via 151, the formation of which is illustrated in the cross-sectional views 1200 and 1300 of FIGS. 12 and 13, may be used to form the IC device 200 of FIG. 2. In some embodiments, the via 151 that grounds the reflector 153 is not formed at all and the reflector 153 is grounded by an alternative route.

Figure 21:
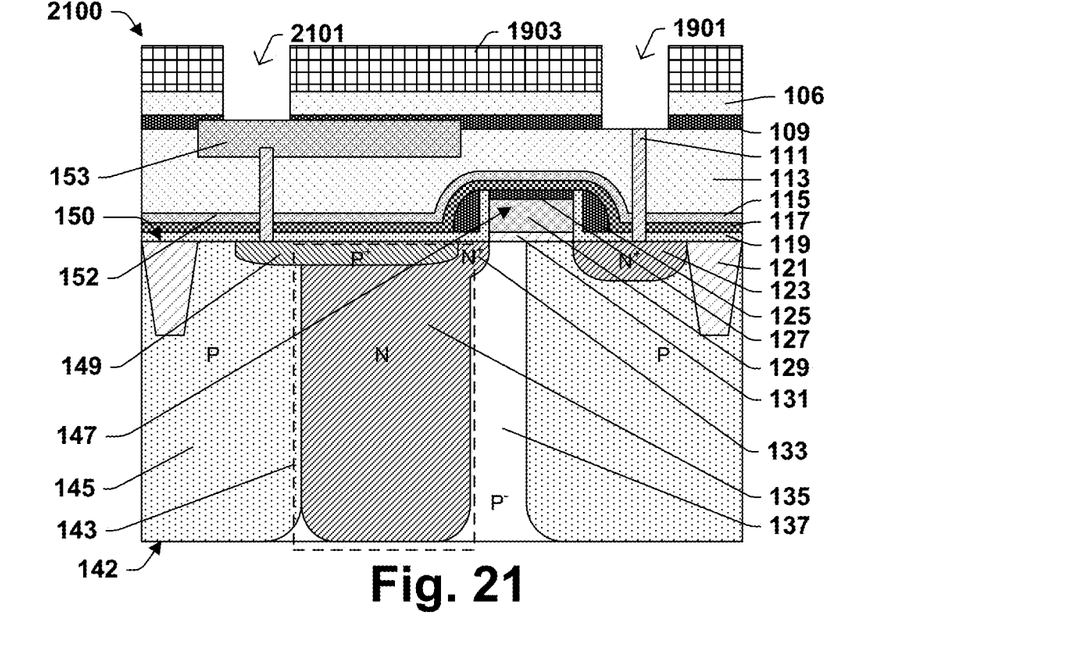
FIGS. 21-22 illustrate a series of cross-sectional views of an IC undergoing a manufacturing process according to some other aspects of the present disclosure.
Figure 22:
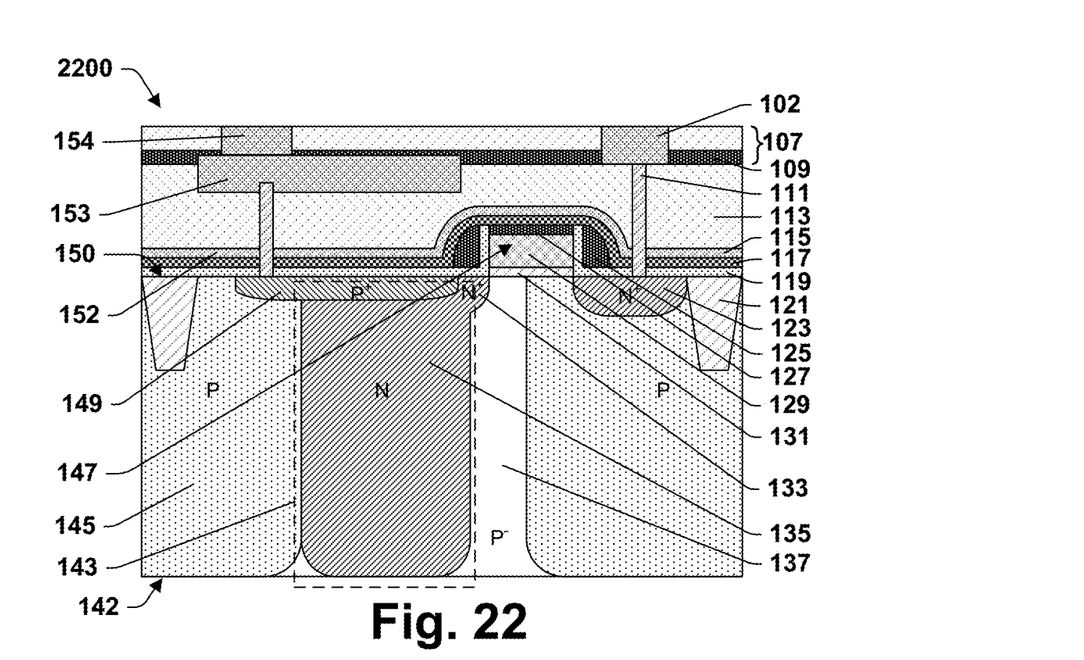

Cross-sectional views 2100 and 2200 of FIGS. 21 and 22 illustrate one alternative process in which the via 151 may not be formed. In addition to not forming the via 151, the process of these figures departs from the one illustrated by the cross-sectional views 400-2000 of FIGS. 4 to 20 in that in addition to forming the opening 1901 in the photoresist 1903 as shown by the cross-sectional view 1900 of FIG. 19, another opening 2101 is formed as shown by the cross-sectional view 2100 of FIG. 21. The opening 2101 is formed over the reflector 153. Then, forming the first metallization layer 107 (M1) by filling the openings 1901, 2101 in the interlevel dielectric layer 106 produces a metal feature 154 that contacts the reflector 153 as shown by the cross-sectional view 2100 of FIG. 21. Further processing of this structure may provide a the IC device 300 shown by FIG. 3.

Figure 23:
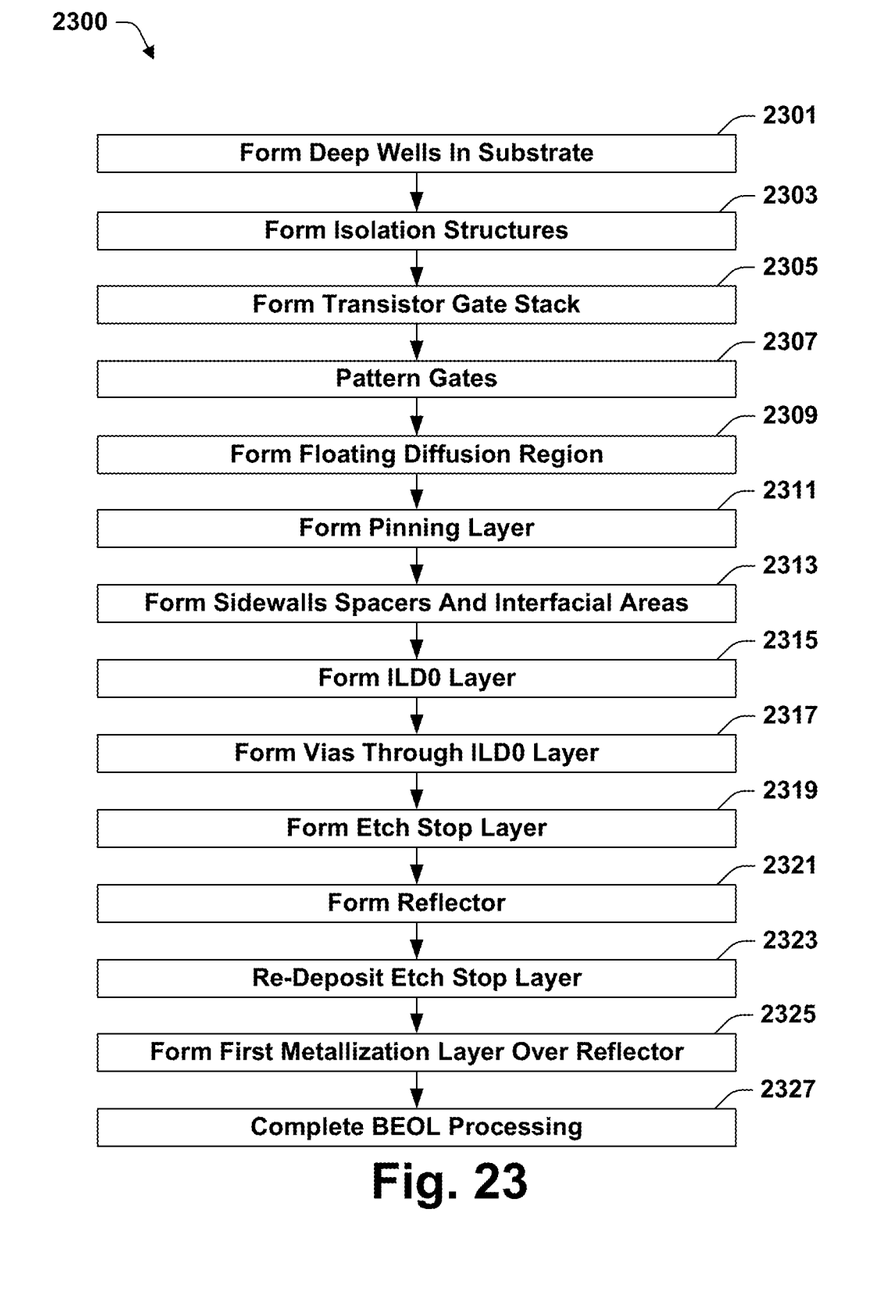
FIG. 23 present a flow chart of a manufacturing process according to some aspects of the present disclosure.

FIG. 23 provides a flow chart of a process 2300 according to some aspects of the present disclosure that may be used to produce integrated circuit devices according to the present disclosure. While the process 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The process 2300 begins with act 2301, forming deep N-wells 135 and deep P-wells 145 in a substrate 137 as shown by the cross-sectional view 400 of FIG. 4. The substrate 137 may initially be lightly doped P. The deep N-wells 135 will correspond to pixels of photodiodes 143 and the deep P-wells 145 may provide isolation between adjacent photodiodes 143.

Act 2303 includes forming isolations structures 121, which are also shown by the cross-sectional view 400 of FIG. 4. The isolation structures 121 may provide electrical isolation between devices formed in the substrate 137 proximate the front side 150.

Act 2305 includes forming a transistor gate stack 502 over the front side 150 as shown in FIG. 5. The transistor gate stack 502 may be used to form one type of transistor. The transistor gate stack 502 may be removed from some areas of the substrate 137 and other transistor gate stacks (not shown) may be formed and patterned to provide other types of transistors.

Act 2307 includes patterning the transistor gate stack 502 to form the transfer transistor 147 as shown by the cross-sectional view 600 of FIG. 6. The patterning of act 2307 may also produce other transistors serving other purposes.

Act 2309 includes doping the substrate 137 as shown by the cross-sectional view 700 of FIG. 7 to form the floating diffusion node 123 and other heavily $N^+$ doped areas such as the source/drain area 133. The transfer transistor 147 may provide alignment for this doping process. A photoresist mask may be used to further restrict the areas that are doped by act 2309.

Act 2311 includes doping as shown by the cross-sectional view 800 of FIG. 8 to define the pinning layer 149 of photodiode 143 as shown in FIG. 8 and other heavily $P^+$ doped areas on the front side 150 of the substrate 137. The areas that receive the heavy $P^+$ doping may be limited by a photoresist 801. In some embodiments, the pinning layer 149 is allowed to extend to the STI region 121.

Act 2313 includes forming the sidewall spacers 125 and the various interfacial layers on the front side 150 of the substrate 137 shown by the cross-sectional views 900-1100 of FIGS. 9-11. The interfacial layers may include the oxide layer 119, the resist protective oxide layer 117, and the etch stop layer 115. The oxide layer 119 may be formed before the sidewall spacers 125. The resist protective oxide layer 117 may be formed after the sidewall spacers 125.

Act 2315 includes forming the first interlevel dielectric layer (ILD0) 113 as shown by the cross-sectional view 1100 of FIG. 11. The first interlevel dielectric layer 113 may be formed with a planar upper surface or its upper surface may be planarized after its formation.

Act 2317 includes forming vias 111, 151 through the first interlevel dielectric layer 113 as shown by the cross-sectional views 1200 and 1300 of FIGS. 12 and 13. In some embodiments, the via 151 is formed to make contact with the pinning layer 149. In some embodiments, the via 151 is formed to make contact with the deep P-well 145. In some embodiments, the via 151 is not formed at all.

Act 2319 includes forming the etch stop layer 109 over the first interlevel dielectric layer 113 as shown by the cross-sectional view 1400 of FIG. 14. Act 2321 includes forming the reflector 153 as shown by the cross-sectional views 1500-1700 of FIGS. 15-17. Forming the reflector 153 may include etching an opening 1503 in the first interlevel dielectric layer 113 as shown in FIG. 15, filling the opening 1503 with metal 1601 as shown in FIG. 16, and chemical mechanical polishing as show in FIG. 17.

Figure 18:
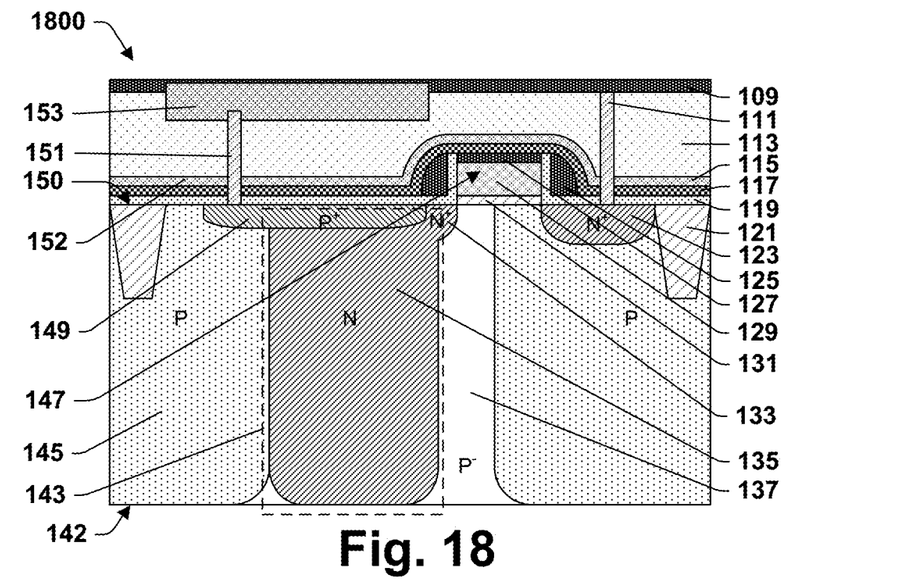

Act 2323 includes redepositing the etch stop layer 109 as shown by the cross-sectional view 1800 of FIG. 18. The redeposition may restore a thickness of the etch stop layer 109 that was lost during formation of the reflector 153 and may also extend the etch stop layer 109 over the reflector 153.

Figure 20:
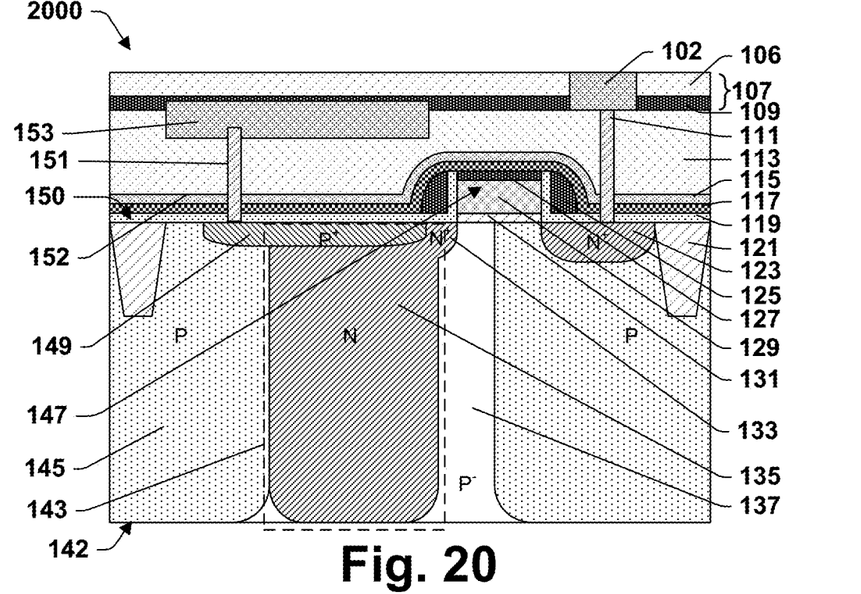

Act 2325 includes forming the first metallization layer 107 over the etch stop layer 109 as shown by the cross-sectional views 1900 and 2000 of FIGS. 19 and 20, or alternatively as shown by the cross-sectional views 2100 and 2200 of FIGS. 21 and 22. The first metallization layer 107 may include metal features 102. In some embodiments, the first metallization layer 107 includes metal features 154 that provide connections to the reflector 153 as shown in FIG. 22. Act 2327 includes additional processing to complete formation of an IC device such as the IC device 100 of FIG. 1, the IC device 200 of FIG. 2, the IC device 300 of FIG. 3, or the like.

Some aspects of the present teachings relate to an integrated circuit (IC) device that include a semiconductor substrate, a photodiode formed within the semiconductor substrate, a metal interconnect structure formed on the semiconductor substrate, and a reflector formed within the metal interconnect structure over the photodiode. According to the present teachings, the reflector is grounded.

Some aspects of the present teachings relate to semiconductor image sensing device. The device includes a radiation-sensing region located in the semiconductor substrate. The radiation-sensing region is operable to sense radiation projected from a back side of the semiconductor substrate. The device further includes a reflector positioned on a front side of the semiconductor substrate. The reflector is operable to reflect light passing through the semiconductor substrate back onto the radiation-sensing region. A connection to the reflector is provided through which the reflector may be coupled to ground. In some of these teachings, the connection is to a metal interconnect structure. In some of these teachings, the connection is to the substrate.

Some aspects of the present teachings relate to a method of manufacturing an integrated circuit (IC) device. The method includes forming a photodiode array in a semiconductor substrate, forming a dielectric layer over the semiconductor substrate, forming vias through the dielectric layer, forming a hard mask over the dielectric layer, using the hard mask to selectively etch an opening partway through the dielectric layer, filing the opening with metal, planarizing the metal to form a reflector, and forming a metal interconnect layer over the dielectric layer and the reflector. The reflector is connected to either one of the vias or a metal feature within the metal interconnect layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a semiconductor substrate;
a photodiode formed within the semiconductor substrate;
a metal interconnect structure formed on the semiconductor substrate; and
a reflector formed within the metal interconnect structure over the photodiode;
wherein the photodiode comprises a P+ doped area;
the metal interconnect structure comprises a metallization layer;
the reflector is grounded either through a via that connects the reflector to the P+ doped area or through direct abutment between an upper surface of the reflector and a lower surface of the metallization layer.

2. The IC device of claim 1, wherein the reflector is grounded to the semiconductor substrate.

3. The IC device of claim 2, wherein the reflector is grounded to the P+ doped area.

4. The IC device of claim 3, wherein the P+ doped area is a pinning layer of the photodiode.

5. The IC device of claim 3, wherein the via is cobalt.

6. The IC device of claim 1, wherein the reflector is grounded through direct abutment between the upper surface of the reflector and the lower surface of the metallization layer.

7. The IC device of claim 1, wherein:
a transistor is formed on the semiconductor substrate;
an interlevel dielectric layer is formed around and over the transistor
the metallization layer is separated from the semiconductor substrate by the interlevel dielectric layer; and
the reflector is formed on the interlevel dielectric layer.

8. The IC device of claim 7, wherein a metal feature within the metallization layer is formed over the reflector and makes contact with the reflector.

9. The IC device of claim 7, wherein:
a plurality of vias are formed in the interlevel dielectric layer; and
one of the plurality of vias is the via that connects the reflector to the P+ doped area.

10. The IC device of claim 9, wherein the interlevel dielectric layer is a low κ dielectric layer.

11. The IC device of claim 1, wherein the photodiode is operative to detect near infrared light.

12. A semiconductor image sensing device, comprising:
a radiation-sensing region located in a semiconductor substrate, the radiation-sensing region being operable to sense radiation projected from a back side of the semiconductor substrate;
a reflector positioned on a front side of the semiconductor substrate, the reflector being operable to reflect light passing through the semiconductor substrate back onto the radiation-sensing region; and
a ground connection for the reflector provided either by a via that connects the reflector to a P+ doped area of semiconductor substrate in the radiation sensing region or by a metallization layer having a lower surface that abuts an upper surface of the reflector.

13. The semiconductor image sensing device of claim 12, wherein the ground connection includes the via.

14. The semiconductor image sensing device of claim 13, wherein the via is cobalt.

15. The semiconductor image sensing device of claim 12, wherein the connection includes a metal feature in the metallization layer.

16. The semiconductor image sensing device of claim 12, wherein the semiconductor image sensing device is operative to detect near infrared light.

17. The semiconductor image sensing device of claim 12, wherein the reflector is spaced from the semiconductor substrate by a low κ dielectric layer.

18. A method of manufacturing an integrated circuit (IC) device, comprising:
forming a photodiode array in a semiconductor substrate;
forming a dielectric layer over the semiconductor substrate;
forming vias through the dielectric layer;
forming a hard mask over the dielectric layer;
using the hard mask to selectively etch an opening partway through the dielectric layer;
filing the opening with metal;
planarizing the metal to form a reflector; and forming a metallization layer over the dielectric layer and the reflector;
wherein the reflector connects to a metal feature within the metallization layer; and
a lower surface of the metal feature abuts an upper surface of the reflector.

19. The method of claim 18, wherein the dielectric layer is a low K dielectric layer.

20. The method of claim 18, wherein the photodiode array is operative to detect near infrared light.

* * * * *